US009799492B2

(12) United States Patent
Blake

(10) Patent No.: US 9,799,492 B2
(45) Date of Patent: Oct. 24, 2017

(54) TEXTURED SILICON LINERS IN SUBSTRATE PROCESSING SYSTEMS

(71) Applicant: Varian Semiconductor Equipment Associates, Inc., Gloucester, MA (US)

(72) Inventor: Julian Blake, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/227,298

(22) Filed: Aug. 3, 2016

(65) Prior Publication Data
US 2016/0343545 A1 Nov. 24, 2016

Related U.S. Application Data

(62) Division of application No. 13/928,815, filed on Jun. 27, 2013, now Pat. No. 9,437,397.

(51) Int. Cl.
*H01J 37/32* (2006.01)
*H01J 37/317* (2006.01)
(Continued)

(52) U.S. Cl.
CPC .......... *H01J 37/3244* (2013.01); *C23C 14/22* (2013.01); *C23C 14/564* (2013.01); *C23C 16/4404* (2013.01); *C23C 16/50* (2013.01); *H01J 37/3171* (2013.01); *H01J 37/32477* (2013.01); *H01J 2237/022* (2013.01); *H01J 2237/028* (2013.01); *H01J 2237/0213* (2013.01); *H01J 2237/0473* (2013.01); *H01J 2237/0475* (2013.01); *H01J 2237/057* (2013.01); *H01J 2237/1207* (2013.01); *H01J 2237/334* (2013.01); *H01J 2237/3321* (2013.01)

(58) Field of Classification Search
USPC ............. 250/492.21, 492.2; 134/10; 438/758
See application file for complete search history.

(56) References Cited

U.S. PATENT DOCUMENTS 5,672,879 A 9/1997 Glavish
9,437,397 B2 9/2016 Blake
(Continued)

FOREIGN PATENT DOCUMENTS

CN 101305443 A 11/2008
JP 2012-518267 A 8/2012
TW 201411679 A 3/2014

OTHER PUBLICATIONS

International Search Report and Written Opinion dated Oct. 16, 2014 in corresponding PCT application No. PCT/US2014/044074.

*Primary Examiner* — Kiet T Nguyen
(74) *Attorney, Agent, or Firm* — Nields, Lemack & Frame, LLC

(57) ABSTRACT

Substrate processing systems, such as ion implantation systems, deposition systems and etch systems, having textured silicon liners are disclosed. The silicon liners are textured using a chemical treatment that produces small features, referred to as micropyramids, which may be less than 20 micrometers in height. Despite the fact that these micropyramids are much smaller than the textured features commonly found in graphite liners, the textured silicon is able to hold deposited coatings and resist flaking. Methods for performing preventative maintenance on these substrate processing systems are also disclosed.

20 Claims, 4 Drawing Sheets

(51) Int. Cl.
*C23C 14/22* (2006.01)
*C23C 14/56* (2006.01)
*C23C 16/44* (2006.01)
*C23C 16/50* (2006.01)

(56) References Cited

U.S. PATENT DOCUMENTS

| | | |
|---|---|---|
| 2005/0003675 A1 | 1/2005 | Carducci et al. |
| 2005/0274910 A1 | 12/2005 | Desai et al. |
| 2007/0102652 A1 | 5/2007 | Ring et al. |
| 2009/0108197 A1 | 4/2009 | Alcott et al. |
| 2009/0206521 A1* | 8/2009 | Begovic ............... C23C 14/564 264/442 |
| 2011/0089321 A1 | 4/2011 | Glavish et al. |
| 2011/0265821 A1 | 11/2011 | Tay et al. |
| 2012/0276750 A1 | 11/2012 | Derderian et al. |
| 2014/0062286 A1 | 3/2014 | Sato |
| 2015/0001391 A1 | 1/2015 | Blake |

\* cited by examiner

TEXTURED SILICON LINERS IN SUBSTRATE PROCESSING SYSTEMS

This application is a divisional of U.S. patent application Ser. No. 13/928,815 filed Jun. 27, 2013, the disclosure of which is incorporated herein by reference in its entirety.

Embodiments of the present disclosure relate to methods and apparatus for lining and texturing parts of a substrate processing system.

BACKGROUND

Semiconductor, solar, or other types of substrates may be processed within various substrate processing systems, such as ion implantation systems, deposition systems and etching systems. Some ion implantation systems may comprise an ion source, extraction electrodes, a mass analyzer, a collimating magnet, one or more acceleration or deceleration stages and a process chamber that holds the substrate. Deposition systems may comprise an ion source, and a target and substrate disposed in a process chamber. These systems may include, for example, the acceleration and deceleration stages, the mass analyzer, the collimating magnet and the process chamber. It is common for components disposed within these systems, such as the interior walls, electrodes, insulators and other equipment to show signs of deterioration or to become coated. This may be due to two different causes. For example, ions or other materials may be deposited on these components. In addition, the components themselves may create particulates when struck by energetic ions, causing contamination downstream. For example, the inner walls of the mass analyzer may be impinged by energetic ions, causing the material used to construct the mass analyzer to sputter. Additionally, materials released further upstream, such as within the ion source, may be deposited on and coat the walls of the mass analyzer. After a layer of sufficient thickness forms, this coating may flake off, causing contamination downstream. In other embodiments, in regions near the substrate, a thin film of photoresist may form on these components.

Currently, liners typically made from graphite are used to address these issues. Graphite is carbon based. Therefore, even if the liner is subject to sputtering, the release of carbon may have a minimal impact to components and substrates disposed downstream. In addition, graphite can be mechanically textured to form a rough inner surface. The textured graphite may have features that are about 0.3 mm in depth. The deposited materials that coat the liner adhere well to this textured surface, thereby reducing the likelihood of flaking.

However, one disadvantage of graphite is that it tends to particulate when struck by energetic ions. This may be due to the microstructure of graphite, which is an assembly of small carbon grains held together in an amorphous carbon matrix. Therefore, it would be advantageous if there were a liner and a texturing method while could be used in ion implantation systems that resisted particulating and did not allow flaking of deposited coatings.

SUMMARY

Substrate processing systems, such as ion implantation systems, deposition systems and etch system having textured silicon liners are disclosed. The silicon liners are textured using a chemical treatment that produces small features, referred to as micropyramids, which may be less than 20 micrometers in height. Despite the fact that these micropyramids are much smaller than the textured features commonly found in graphite liners, the textured silicon is able to hold deposited coatings and resist flaking.

According to one embodiment, a substrate processing system is disclosed, which comprises a process chamber, having a plurality of chamber walls, in which the substrate is disposed; a feed gas source in communication with the process chamber; a plasma generator to create a plasma from the feed gas; and a silicon liner disposed on a surface of at least one of the chamber walls of the process chamber, wherein a surface of the silicon liner is textured. The textured silicon liner may have micropyramids having a height of less than 20 micrometers.

According to another embodiment, an ion implantation system is disclosed, comprising an ion source; a process chamber in which a substrate is disposed; and a silicon liner, disposed within the system, where at least one surface of the silicon liner is textured. The textured silicon liner may have micropyramids having a height of less than 20 micrometers.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
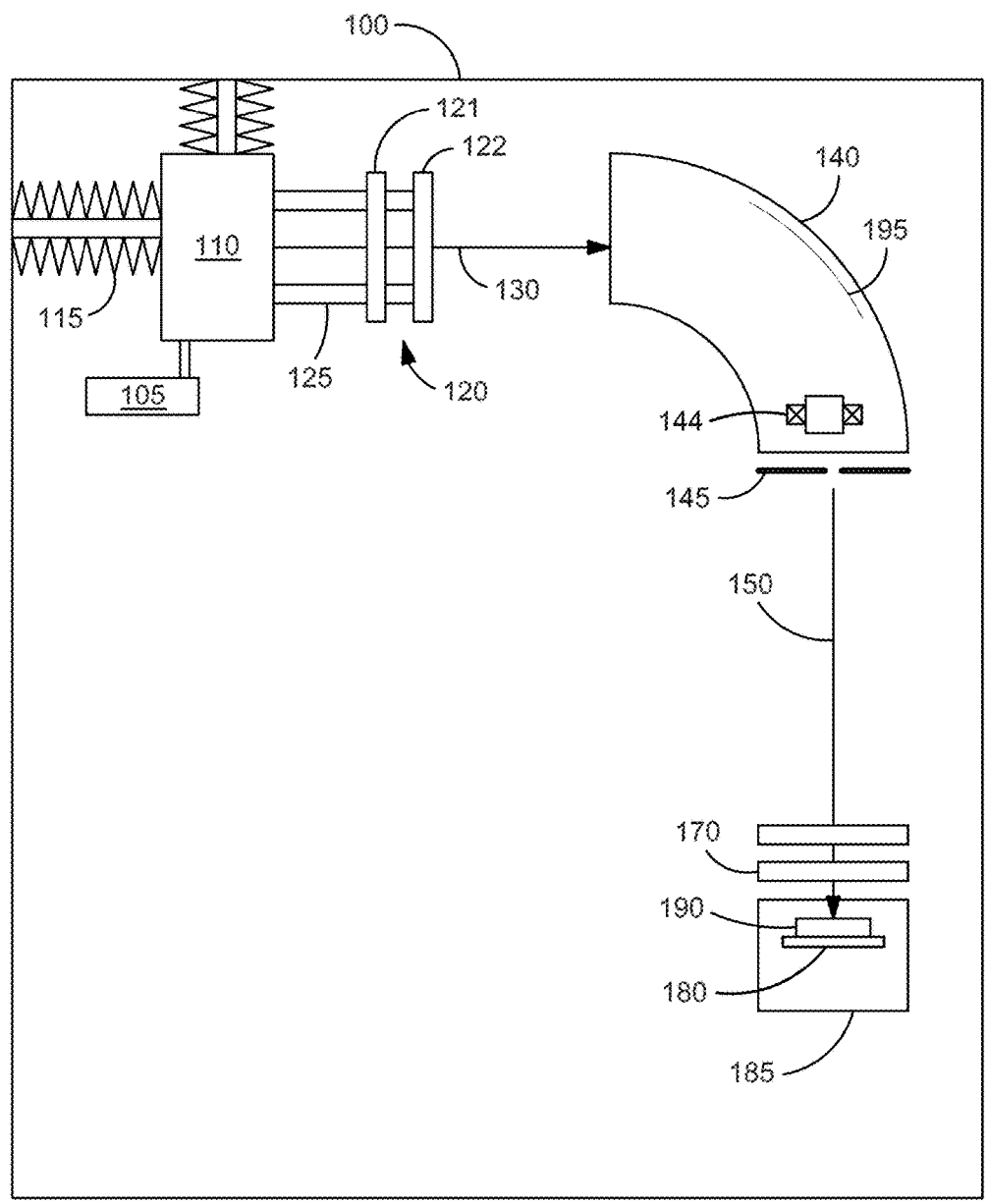
FIG. 1 shows a representative ion implantation system according to one embodiment.

FIG. 1 shows a representative ion implantation system that may be used in accordance with one embodiment. In this system, there is an ion source 110, which is in communication with a feed gas source 105. Feed gas is supplied to the ion source 110 from a feed gas source 105. The feed gas may be any suitable gas. For example, in some embodiments, a boron-containing gas, such as $BF_3$ or diborane, may be used. In other embodiments, a phosphorus containing gas, such as $PH_3$, may be used.

In one embodiment, the ion source 110 may include an indirectly heated cathode (IHC), housed within a tungsten chamber. This ion source 110 may be contained within a larger housing 100. As the ion source 110 is typically biased at a substantial voltage, it may be necessary to electrically isolate the ion source 110 from the housing 100. This may be achieved through the use of source bushings 115.

Outside the ion source 110 are one or more electrodes 120, which are appropriately biased to attract ions generated in the ion source 110. The electrodes 120 draw these ions to, and then through the electrode 120. In some embodiments, there may be multiple electrodes 120, such as an extraction electrode 121 and a suppression electrode 122. These electrodes 120 may be at different voltages, and therefore must be electrically isolated from one another. These may be achieved through the use of an insulated manipulator assembly 125, which holds the electrodes 120 in place.

The extracted ion beam 130 may then enter a mass analyzer 140. The ion beam flows through a guide tube (not shown) in the mass analyzer. In some embodiments, a focusing element, such as a quadrupole lens 144 or Einsel lens, may be used to focus the ion beam. A resolving aperture 145 is disposed at the output of the mass analyzer 140, which extracts only ions having the desired charge/mass ratio. The analyzed ion beam 150, which now contains only the ions of interest, is then implanted into the substrate 190, which may be mounted on a substrate support 180. In some embodiments, one or more acceleration or deceleration stages 170 may be employed to adjust the speed of the analyzed ion beam 150. These acceleration or deceleration stages 170 may be disposed proximate a process chamber 185. The substrate 190 and substrate support 180 may be disposed in the process chamber 185.

Those of ordinary skill in the art recognize that other components, not shown in FIG. 1, may also be part of the ion implantation system. Those of ordinary skill in the art also recognize that various components in FIG. 1, such as the mass analyzer 140 or acceleration or deceleration stages 170, may be not used in certain ion implantation systems.

Regions which are particularly susceptible to sputtering and coating, such as the walls of the mass analyzer 140 may be lined. Other susceptible regions may include the liners of focusing components, such as quadrupole and Einsel lens 144, and acceleration or deceleration electrode assemblies where the ion beam travels in close proximity to liner materials. In accordance with one embodiment, the liner 195 may be silicon, rather than graphite. Silicon has several advantages. First, silicon is very inexpensive, readily available, and available at very high levels of purity. In addition, it may the same material as the substrate being processed. Therefore, any particulate generated by the liner 195 causes minimal contamination. In addition, silicon tends to generate less particulate than graphite.

Despite all these benefits, unfortunately, polished silicon does not retain or hold deposited material well. Additionally, silicon, unlike graphite, is very difficult to mechanically texture. Therefore, the flaking off of coated materials may be problematic.

Unlike conventional graphite liners, the silicon liners 195 of the present disclosure are textured using a chemical process. Texturing, as used in this disclosure, is defined as the introduction of imperfections to the surface of the liner to increase its surface area. Thus, texturing is used to roughen the surface of the liner. This increase in surface area improves the liner's ability to retain coated materials. Texturing may be performed using mechanical means or chemical means. This textured, or roughened surface, is disposed in the system so as to face the interior of the system.

In one embodiment, silicon sheets are provided that may be sized to the area or region of the ion implantation system being lined. In another embodiment, the silicon sheets have known or specific sizes, and a plurality of sheets are used to create a liner of the desired size, which is used to line the desired region.

The silicon liners 195 are disposed on components of the implantation system. As described above, these liners may be disposed on the mass analyzer 140, the resolving aperture 145, the walls of the process chamber, focusing components, electrodes or other areas. In some embodiments, the silicon liners 195 are placed on components that are not electrically biased, such as non-powered electrodes.

However, in other embodiments, the component to be lined by be biased at an electrical voltage, such as the mass analyzer 140. Since silicon is naturally non-conductive, the silicon liner may be doped to cause the liner to be electrically conductive. For example, boron or phosphorus doping of the silicon liners may reduce the bulk resistivity to below 10 ohm-cm.

Figure 2:
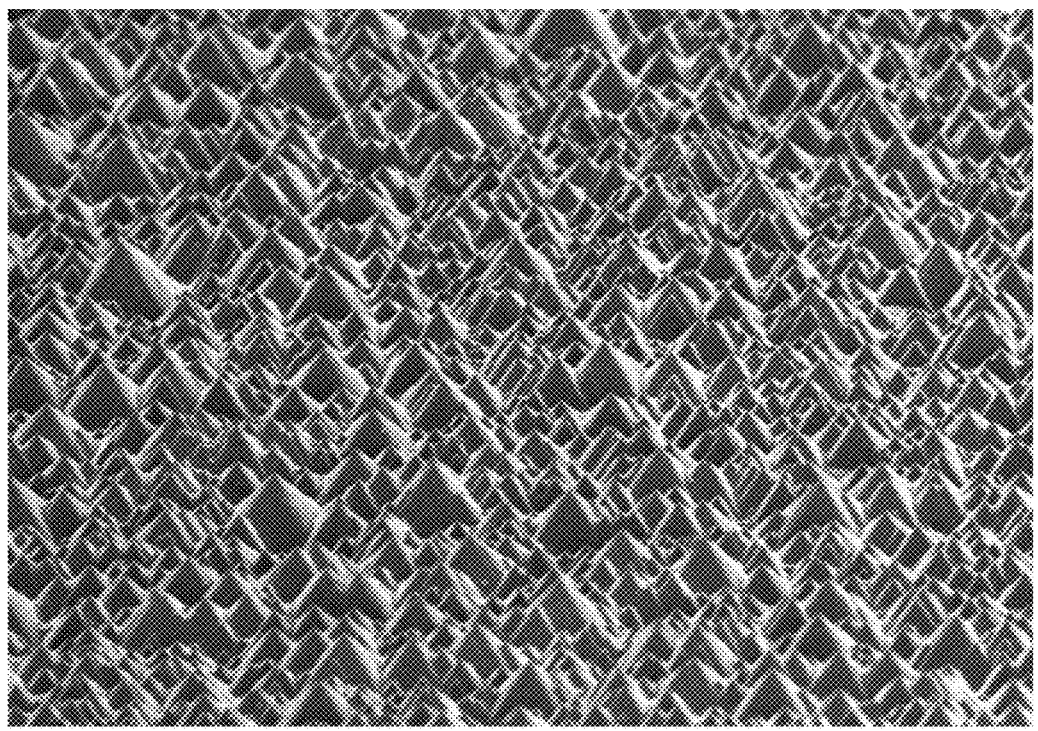
FIG. 2 shows a magnified view of the surface of a silicon liner.

In any of these embodiments, the liner 195 is applied such that the (100) crystalline surface is exposed to the ion beam. This surface, referred to as the exposed surface, is treated with a hydroxide, such as sodium hydroxide or barium hydroxide. This treatment causes the creation of micropyramids on the exposed surface of the silicon liner 195. A magnified representation of this treated surface is shown in FIG. 2. The micropyramids seen in this FIG. may be about 5 micrometers in height. In other embodiments, these micropyramids may be about 10 micrometers in height. In other embodiments, these micropyramids may be as tall as 20 micrometers. Furthermore, as seen in FIG. 2, the height and spacing of these micropyramids is irregular, such that the micropyramids have a range of heights. Similarly, the distances between these micropyramids may vary as well. In other words, the chemical texturing of silicon creates features that may be more than 50 times smaller than the features traditionally found on textured graphite liners. Surprisingly, this textured surface may hold onto deposited materials more tenaciously than cut or polished silicon, and may hold onto the deposited materials as well as the more deeply textured graphite liners.

Thus, in one embodiment, an ion implantation system comprises at least one surface, which is lined with a silicon liner that has been chemically treated to create a roughened exposed surface. This chemical treatment may be done via exposure to a hydroxide, such as a hot hydroxide solution.

Figure 3:
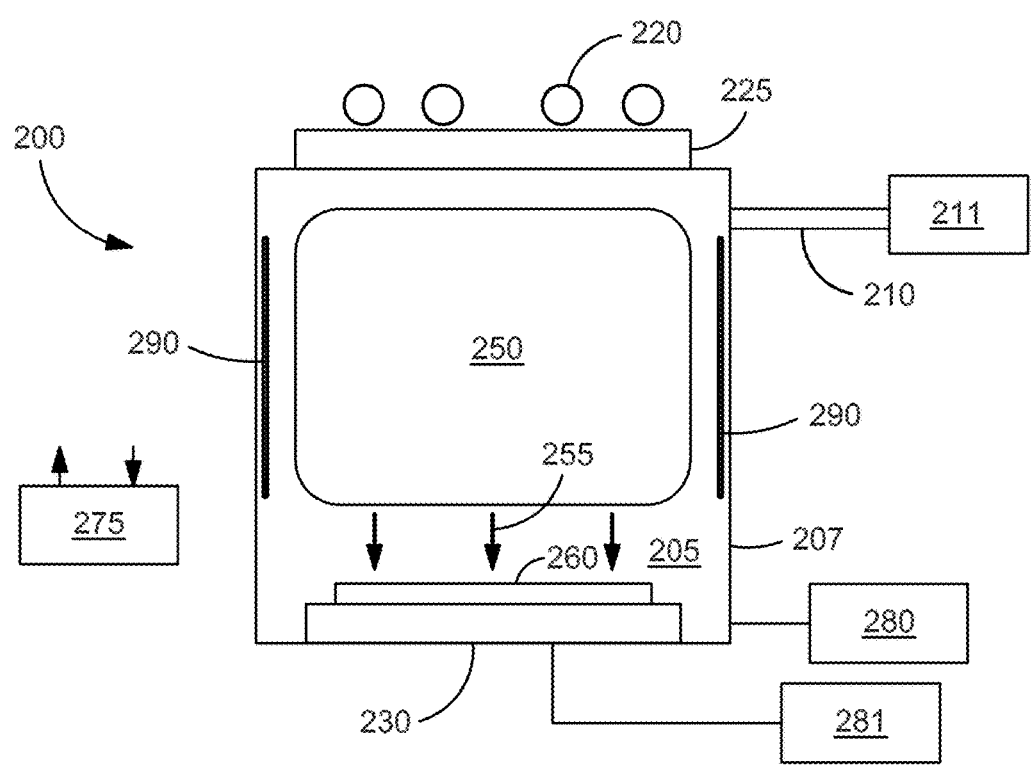
FIG. 3 shows a representative ion implantation system according to another embodiment.

While FIG. 1 and the above disclosure describe a beamline ion implantation system, the textured silicon liners may be employed in other types of ion implantation systems. For example, FIG. 3 shows a substrate processing system 200. In one embodiment, this substrate processing system 200 may be a PLAD implant system. In this embodiment, the PLAD implant system 200 includes a chamber 205 defined by several walls 207, which may be constructed from graphite, silicon, silicon carbide or another suitable material. This chamber 205 may be supplied with a feed gas, which is contained in a feed gas source 211, via a gas inlet 210. This feed gas may be energized by a plasma generator. In some embodiments, an RF antenna 220 or another mechanism is used to create plasma 250. The RF antenna 220 is in electrical communication with a RF power supply (not shown) which supplies power to the RF antenna 220. A dielectric window 225, such as a quartz or alumina window, may be disposed between the RF antenna 220 and the interior of the implant chamber 205. The system 200 also includes a controller 275. The controller 275 may receive input signals from a variety of systems and components and provide output signals to each to control the same.

Positively charged ions 255 in the plasma 250 are attracted to the substrate 260 by the difference in potential between the chamber 205 (which defines the potential of the plasma 250) and the substrate 260. In some embodiments, the walls 207 may be more positively biased than the substrate 260. For example, the walls 207 may be in electrical communication with a chamber power supply 280, which is positively biased. In this embodiment, the substrate 260 is in communication with a platen 230, which is in communication with bias power supply 281, which is biased at a voltage lower than that applied by chamber power supply 280. In certain embodiments, the bias power supply 281 may be maintained at ground potential. In a second embodiment, the chamber power supply 280 may be grounded, while the bias power supply 281 may be biased at a negative voltage. While these two embodiments describe either the substrate 260 or the walls 207 being at ground potential, this is not required. The ions 255 from the plasma 250 are attracted to the substrate 260 as long as the walls 207 are biased at any voltage greater than that applied to the platen 230.

Liners 290 may be disposed within the chamber 205, such as along the inner surfaces of walls 207. The liner 290 may be glued or otherwise adhered to the chamber walls 207, such that the (100) crystalline surface of the liner is facing towards the interior of chamber 205. In other words, this (100) crystalline surface is exposed to the coating materials generated within the chamber 205.

Figure 4:
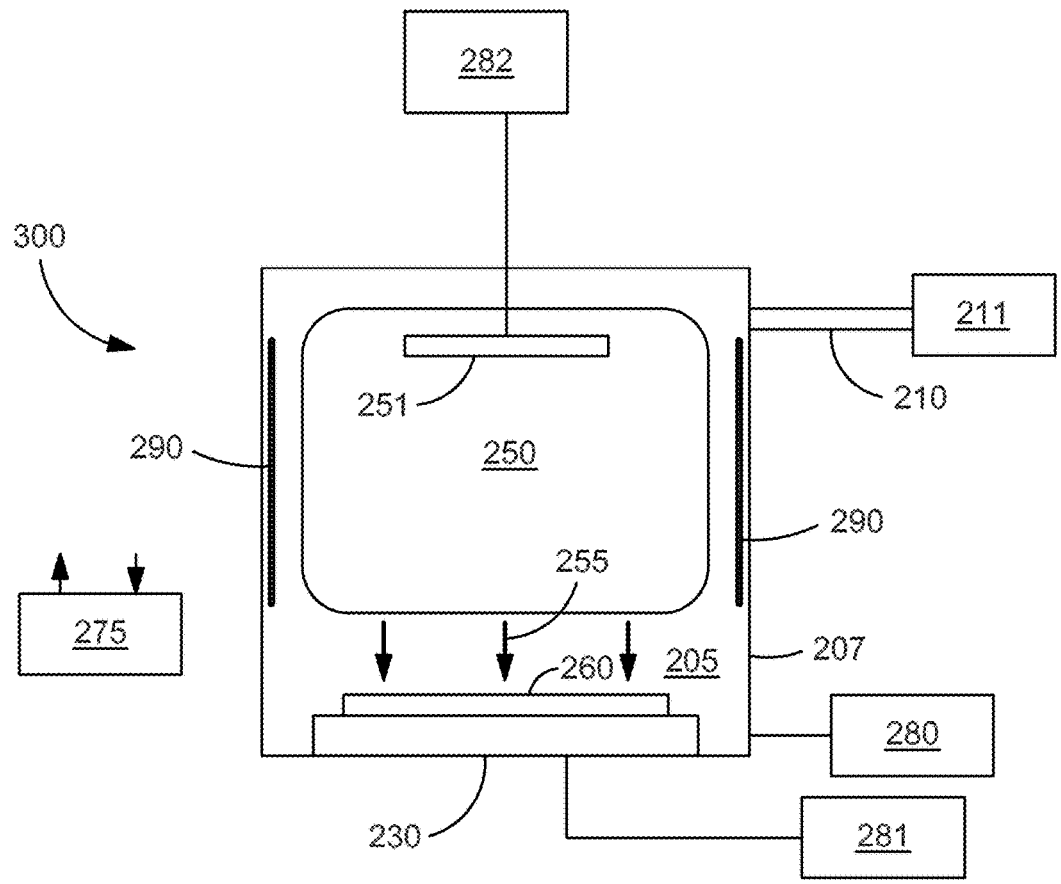
FIG. 4 shows a representative deposition and etching system.

The system shown in FIG. 4 may be used as a deposition or etching chamber. This system 300 is similar to that shown in FIG. 3. Elements having the same function are given the same reference designators and are not described again. Low temperature deposition system may belong to one of two categories: Physical Vapor Deposition (PVD) or Plasma Enhanced Chemical Vapor Deposition (PECVD).

PVD, also called "atomic sputtering", uses a target 251 of the material to be deposited and employs a power supply 282 to apply a negative potential to the target 251. The vacuum process chamber, which may be chamber 205 in FIG. 4, contains both the target 251 and the substrate 260 that is to receive the coating. The chamber 205 is backfilled with a gas (typically Ar) to a pressure of a few millitorr. The potential applied to the target 251 by power supply 282 creates a plasma 250 of the gas, and positive ions within the plasma 250 are attracted to the target 251, striking it with enough energy to dislodge target atoms. These atoms are ejected from the target 251, travelling in all directions, the trajectories described as a cosine distribution, and strike chamber walls 207, protective liners 290 and the substrate 260. Thus, in this embodiment, the biased target 251 may serve as the plasma generator. In some embodiments, an ion source, typically of the Kauffman type, can be introduced to bombard the substrate 260 with ions during the deposition process ("ion assisted deposition"). PVD is typically used to apply metal coatings such as Al, Cu, Ni and Ti to form contacts and interconnects in integrated circuits.

PECVD uses a process gas containing the material to be deposited and therefore does not include the target 251 and power supply 282 shown in FIG. 4. A plasma 250 is created in the vacuum process chamber 205 by a plasma generator, such as an inductively or capacitive coupling of RF power into the process gas, which may be performed using RF antenna 220 (see FIG. 3). This plasma 250 causes the process gas to dissociate, causing all exposed surfaces including the substrate 260 to become coated. An example is the deposition of amorphous silicon by the dissociation of $SiH_4$. A mixture of process gasses can also be employed to deposit compounds such as $Si_3N_4$ or $SiO_2$. PECVD is typically used to apply dielectric coatings serving as barriers or interlevel dielectrics in integrated circuits.

In another embodiment, the chamber of FIG. 4 can be used to create an etching station. In plasma or "dry" etching, the plasma generator may be capacitively coupled to the chamber 205. For example, RF power is delivered to the substrate 260 through capacitive coupling. The vacuum process chamber 205 is backfilled with either an inert (typically Ar) gas for a process called "sputter etching," or with a reactive gas ($NF_3$, $CF_4$, or a mixture of reactive gasses) for a process called "reactive ion etching." The material removed from the substrate 260 may deposit on the chamber walls 207 and liners 290, and may form a volatile compound with the reactive gas and be pumped away.

As with all liners, eventually, in all of these embodiments, a coating builds on the liner which must be removed. These textured silicon liners may allow the substrate processing systems to remain operational longer than previously possible before preventative maintenance is required. In addition, cleaning of these textured silicon liners may be less burdensome and difficult than traditional graphite liners. According to one embodiment, a cleaner, such as a mixture of deionized water and isopropyl alcohol (IPA), which is used to remove a specific film may be used. In another embodiment, grit blasting may be employed to remove the coating. This grit blasting process may be a dry or wet process. In some embodiments, this cleaning process may remove the texture from the silicon liner. In these embodiments, the roughness of the liner may be restored by exposing the exposed surface to another chemical treatment, such as exposure to a hot hydroxide solution as described herein. Thus, a first cleaning step is performed, which may be mechanical (i.e. grit) or chemical (i.e. cleaning solution). After this, the cleaned liner is then exposed to a chemical treatment which retextures the liner. Thus, even after a cleaning cycle, the texture of the silicon liners can be quickly and economically restored.

Texturing of the silicon liner removes about 5-10 micrometers of material. Since the silicon liner may be between 0.5 and 3 millimeters (several hundred times thicker than the depth of material removed by texturing), the liner may be reconditioned (i.e. retextured) many times before needing to be replaced. Thus, the silicon liner may be subjected to multiple preventative maintenance cycles before reaching the end of its useful life.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A substrate processing system, comprising:
   a process chamber, having a plurality of chamber walls, in which a substrate is disposed;
   a feed gas source in communication with said process chamber;
   a plasma generator to create a plasma from said feed gas; and
   a silicon liner disposed on a surface of at least one of said chamber walls of said process chamber, wherein a surface of said silicon liner facing an interior of said process chamber is textured, and wherein said textured surface of said silicon liner comprises micropyramids having a height of less than 20 micrometers.

2. The substrate processing system of claim 1, wherein said micropyramids vary in height.

3. The substrate processing system of claim 1, wherein spacing between said micropyramids varies.

4. The substrate processing system of claim 1, wherein said textured surface of said silicon liner comprises a chemically treated surface.

5. The substrate processing system of claim 1, wherein the silicon liner is textured by treating the surface with a hydroxide.

6. The substrate processing system of claim 5, wherein the hydroxide is one of sodium hydroxide or barium hydroxide.

7. The substrate processing system of claim 1, wherein said at least one of the chamber walls is electrically biased and said silicon liner is doped so as to reduce its bulk resistivity.

8. A substrate processing system, comprising:
   a process chamber, having a plurality of chamber walls, in which a substrate is disposed;
   a feed gas source in communication with said process chamber;
   an electrically biased target disposed in the process chamber; and
   a silicon liner disposed on a surface of at least one of said chamber walls of said process chamber, wherein a surface of said silicon liner facing an interior of said process chamber is textured, and wherein said textured surface of said silicon liner comprises micropyramids having a height of less than 20 micrometers.

9. The substrate processing system of claim 8, wherein said micropyramids vary in height.

10. The substrate processing system of claim 8, wherein spacing between said micropyramids varies.

11. The substrate processing system of claim 8, wherein said textured surface of said silicon liner comprises a chemically treated surface.

12. The substrate processing system of claim 8, wherein the silicon liner is textured by treating the surface with a hydroxide.

13. The substrate processing system of claim 12, wherein the hydroxide is one of sodium hydroxide or barium hydroxide.

14. The substrate processing system of claim 8, wherein said at least one of the chamber walls is electrically biased and said silicon liner is doped so as to reduce its bulk resistivity.

15. A substrate processing system, comprising:
   a process chamber, having a plurality of chamber walls, in which a substrate is disposed;
   a feed gas source in communication with said process chamber;
   a plasma generator to create a plasma from said feed gas; and
   a silicon liner disposed on a surface of at least one of said chamber walls of said process chamber, wherein a surface of said silicon liner facing an interior of said process chamber is textured by treating the surface with a hydroxide.

16. The substrate processing system of claim 15, wherein the hydroxide is one of sodium hydroxide or barium hydroxide.

17. The substrate processing system of claim 15, wherein said at least one of the chamber walls is electrically biased and said silicon liner is doped so as to reduce its bulk resistivity.

18. A substrate processing system, comprising:
   a process chamber, having a plurality of chamber walls, in which a substrate is disposed;
   a feed gas source in communication with said process chamber;
   an electrically biased target disposed in the process chamber; and
   a silicon liner disposed on a surface of at least one of said chamber walls of said process chamber, wherein a surface of said silicon liner facing an interior of said process chamber is textured by treating the surface with a hydroxide.

19. The substrate processing system of claim 18, wherein the hydroxide is one of sodium hydroxide or barium hydroxide.

20. The substrate processing system of claim 18, wherein said at least one of the chamber walls is electrically biased and said silicon liner is doped so as to reduce its bulk resistivity.

* * * * *